(12) United States Patent
Kwak et al.

(10) Patent No.: US 9,017,570 B2
(45) Date of Patent: Apr. 28, 2015

(54) HYBRID FILLER FOR ELECTROMAGNETIC SHIELDING COMPOSITE MATERIAL AND METHOD OF MANUFACTURING THE HYBRID FILLER

(75) Inventors: Jin Woo Kwak, Gyeonggi-do (KR); Kyong Hwa Song, Seoul (KR); Han Saem Lee, Gyeonggi-do (KR); Byung Sam Choi, Gyeonggi-do (KR)

(73) Assignee: Hyundai Motor Company, Seoul (KR)

(*) Notice: Subject to any disclaimer, the term of this patent is extended or adjusted under 35 U.S.C. 154(b) by 351 days.

(21) Appl. No.: 13/556,700

(22) Filed: Jul. 24, 2012

(65) Prior Publication Data
US 2013/0299732 A1 Nov. 14, 2013

(30) Foreign Application Priority Data
May 8, 2012 (KR) .................. 10-2012-0048599

(51) Int. Cl.
| | |
|---|---|
| H01F 1/00 | (2006.01) |
| H01F 1/28 | (2006.01) |
| H01F 1/14 | (2006.01) |
| B82Y 30/00 | (2011.01) |
| H05K 9/00 | (2006.01) |
| B82Y 40/00 | (2011.01) |

(52) U.S. Cl.
CPC ............ *H05K 9/0083* (2013.01); *B82Y 30/00* (2013.01); *B82Y 40/00* (2013.01); *H01F 1/28* (2013.01); *H05K 9/009* (2013.01); *Y10S 977/742* (2013.01)

(58) Field of Classification Search
USPC ............... 252/62.54, 62.51 R, 62.53, 252/62.55–62.51 C, 509–513, 478; 427/130, 427/180; 428/690, 323, 627, 615, 532; 349/59; 977/742, 810, 893
See application file for complete search history.

(56) References Cited

U.S. PATENT DOCUMENTS

2014/0030590 A1* 1/2014 Wang et al. ............. 429/211

FOREIGN PATENT DOCUMENTS

| | | |
|---|---|---|
| JP | 03-006898 | 1/1991 |
| JP | 2001267782 A | 9/2001 |
| JP | 2002290094 A | 10/2002 |
| JP | 2004327727 A | 11/2004 |
| KR | 10-2003-0019527 | 3/2003 |

(Continued)

OTHER PUBLICATIONS

Schemme et al., "Magnesium Motorcycle Wheels for Racing Applications", May 2006, Magensium Alloys and Their Applications, pp. 391-396.*

(Continued)

*Primary Examiner* — Carol M Koslow
*Assistant Examiner* — Lynne Edmondson
(74) *Attorney, Agent, or Firm* — Mintz Levin Cohn Ferris Glovsky and Popeo, P.C.; Peter F. Corless

(57) ABSTRACT

Disclosed is a hybrid filler for an electromagnetic shielding composite material and a method of manufacturing the hybrid filler, by which electromagnetic shielding and absorbing capabilities are improved and heat generated by electromagnetic absorption is effectively removed. The hybrid filler for an electromagnetic shielding composite material includes an expandable graphite (EG) having a plurality of pores, and magnetic particles integrated with a carbon nanotube (CNT) on outer surfaces thereof in a mixed manner, wherein the magnetic particles are inserted into the pores of the EG.

15 Claims, 3 Drawing Sheets

(56) References Cited

FOREIGN PATENT DOCUMENTS

| KR | 10-2003-0096140 | 12/2003 |
| KR | 10-2010-0004399 | 1/2010 |
| KR | 10-2011-0016287 | 2/2011 |
| KR | 10-2011-0016289 | 2/2011 |
| KR | 10-2011-0017536 | 2/2011 |
| KR | 10-2011-0115850 | 10/2011 |
| KR | 10201101158507 A1 * | 10/2011 |
| KR | 10-2012-0023490 | 3/2012 |

OTHER PUBLICATIONS

Zhang et al., "Polymer Nanocomposites Using Urchin-Shaped Carbon Nanotube-Silica Hybrids as Reinforcing Fillers", 2004, Macromol. Rapid. Commun., vol. 25, pp. 1860-1864.*

Machine translation of KR10201101158507A1, printed Jul. 30, 2014.*

* cited by examiner

HYBRID FILLER FOR ELECTROMAGNETIC SHIELDING COMPOSITE MATERIAL AND METHOD OF MANUFACTURING THE HYBRID FILLER

CROSS-REFERENCE TO RELATED APPLICATION

This application claims under 35 U.S.C. §119(a) the benefit of Korean Patent Application No. 10-2012-0048599 filed on May 8, 2012, the entire contents of which are incorporated herein by reference.

BACKGROUND (a) Technical Field

The present disclosure relates to a hybrid filler for an electromagnetic shielding composite material and a method of manufacturing the hybrid filler. More particularly, the present disclosure relates to a hybrid filler for an electromagnetic shielding composite material and a method of manufacturing the hybrid filler, which provides improved electromagnetic shielding and absorbing capabilities and which effectively removes heat generated by electromagnetic absorption.

(b) Background Art

Generally, electrical/electronic parts operated by power supplied from batteries, parts including small substrates having assembled thereon small elements such as resistors, and parts including combinations of mechanical apparatuses with such parts are all referred to as vehicle electrical/electronic parts.

Recently, the use of such electrical/electronic parts in vehicles has increased, particularly with the rising demand for eco-friendly vehicles, such as electric vehicles.

As the use of electrical/electronic parts rises, the need for materials having an electromagnetic shielding function to maintain safety and lifespan of the parts, and to prevent malfunction of the parts increases.

It is known that an electromagnetic wave causes malfunction of various electrical/electronic parts and is emitted or conducted from the parts. This can obstruct the performance of other devices, and may also cause changes in the human body such as stress, stimulation of the nervous system, and cardiac disorders.

Generally, an electromagnetic wave refers to a sort of "electromagnetic energy" generated in an electrical and magnetic flow. Upon generation of vibration when electricity flows, an electric field and a magnetic field which have different features are generated at the same time. The electromagnetic wave is a wave generated as the electric field and the magnetic field are periodically changed. Electromagnetic waves are inevitably generated in all devices using electricity.

An electric field (V/m) is generated proportional to the strength of a voltage and is easily shielded by a high-conductivity object. A magnetic field (mG) is generated proportional to the magnitude of a current and cannot be shielded due to its feature of returning to a region where it is generated.

Generally, an electromagnetic interference (EMI) shielding effect (EMI S.E.) is achieved when an electromagnetic wave incident to a test piece is reflected (R) from the surface of the test piece or absorbed (A) into the test piece, so that current is generated and transformed into heat through a resistor to pass through the resistor.

In most electrical/electronic parts, metallic materials are used to shield electromagnetic waves. When electromagnetic waves contact the metal surface, an eddy current generated by electromagnetic induction in a conductor reflects (R) the electromagnetic wave.

However, inter-path interference of an internal circuit board and interference with peripheral electronic devices can occur due to the reflected electromagnetic wave. As such, a material capable of shielding or absorbing the electromagnetic wave is required.

Use of a plastic part as an electromagnetic shielding material is advantageous in terms of moldability (processability) and economical efficiency. Thus, the demand for such plastic parts has continuously increased due to its lightness in weight and high degree of freedom of design.

However, general plastic and plastic composite materials (structural composite) lack the conductivity of metal, and thus its adoption as a housing (case) of electrical/electronic parts for electromagnetic shielding is limited.

Because a plastic material has low crystallinity of a high polymer structure based on common coupling, an electromagnetic wave will completely penetrate the plastic material rather than become absorbed therein or reflected therefrom. Thus, research is actively being conducted to manufacture a composite material by dispersing within a plastic matrix a filler having superior conductivity to improve the EMI S.E. of the plastic material.

A conventional plastic composite material for electromagnetic shielding is manufactured by dispersing a metallic filler having excellent electric conductivity, such as silver, copper, etc., or a carbon-based filler such as graphite, carbon fiber, carbon nanotube, etc., with a volume content of 30% or more in a resin such as polyurethane, polycarbonate, epoxy, etc., so that a shielding effect of about 50 dB can be obtained.

A conductive filler used to manufacture the electromagnetic shielding composite material is mostly a metallic or carbon-based single filler. To shield an electrical field, a conductive filler of a high permittivity is favorable. To shield a magnetic field, a filler of a high permeability is useful. Therefore, for efficient electromagnetic shielding, it is desirable to manufacture a composite material by hybridizing fillers having such features.

Electromagnetic shielding for a composite material is described so that an electromagnetic wave incident as shown in FIG. 1 meets a conductive filler (steel fiber in FIG. 1) dispersed in plastic, causing multi-reflection or absorption, and thus the strength of the electromagnetic wave is attenuated and only a portion of the electromagnetic wave penetrates.

The absorbed electromagnetic wave causes movement of electrons of the filler dispersed in the matrix, generating current and resistance which are emitted as heat energy.

If the emitted heat energy is accumulated in the matrix or the emission speed thereof is slow, the shielding effect is degraded. Therefore, the EMI S.E. can be improved when the emitted heat energy is removed.

When a magnetic material is dispersed in the matrix of the composite material, a magnetic field absorption phenomenon occurs. This is due to a magnetic loss, in which an induced current is generated in the magnetic material due to the incident magnetic field and is transformed into heat energy (related document regarding EMI absorption of a magnet: IEEE Transaction on Magnetics, 44 (11), 2008, 3934-3937; J of the Korean Physical Society, 42 (6), 2003, 799~802; J of Magnetism and Magnetic Materials 324, 2012, 1225-1229).

At present, work related to electromagnetic shielding is directed towards techniques which use a material having high conductivity alone.

U.S. Patent Application Publication No. 2006/0099403 mentions a technique for simultaneously using an electromagnetic shielding material and a heat radiant material, and suggests a method for manufacturing a composite material by mixing a shielding material, such as aluminum, iron, silver, magnetic, etc., with a heat conductive heat-radiant material, such as metal or ceramic powder, in a single layer.

However, in U.S. Patent Application Publication No. 2006/0099403, if 2 types of conductive materials (shielding material and heat radiant material) composed of spherical particles are not uniformly dispersed and hardened in an agglomerate form, both shielding and heat radiant features cannot be obtained at the same time. Rather, an electromagnetic shielding portion and a heat radiant portion are locally formed, respectively.

SUMMARY OF THE DISCLOSURE

The present invention has been made in an effort to solve the above-described problems associated with prior art, and provides a hybrid filler for an electromagnetic shielding composite material and a method of manufacturing the hybrid filler. In particular, the present hybrid filler and method of manufacture provide improved shielding and absorbing capabilities of incident electromagnetic waves, and further provides effective removal of heat generated by absorbed electromagnetic waves.

In one aspect, the present invention provides a hybrid filler for an electromagnetic shielding composite material, the hybrid filler including a combination of a graphite material and magnetic particles integrated with carbon nanotubes (CNT). According to various embodiments, the present invention provides a hybrid filler including a mixture of an expandable graphite (EG) having a plurality of pores, and magnetic particles integrated with a carbon nanotube (CNT) on outer surfaces thereof. According to various embodiments, the magnetic particles are disposed within the pores of the EG.

In another aspect, the present invention provides a method of manufacturing a hybrid filler for an electromagnetic shielding composite material, the method including manufacturing EG having a plurality of pores, manufacturing CNT-coated magnetic particles by adhering a CNT on outer surfaces of the magnetic particles, dispersing the CNT-coated magnetic particles in a solvent to provide a magnetic particle dispersed solution, contacting the EG with the magnetic particle dispersed solution, such as by dipping the EG into the magnetic particle dispersed solution, so that the magnetic particle dispersed solution permeates into the pores of the EG, and evaporating the solvent by drying the magnetic particle dispersed solution into which the EG is dipped.

According to a preferred embodiment, the magnetic particle dispersed solution contains about 97-99.5 wt % of deionized water and about 0.5-3 wt % of the CNT coated magnetic particles (wherein the deionized water and CNT coated particles together form 100 wt %). To this magnetic particle dispersed solution, 0.5-1 wt % of the EG is added (wherein the EG and the magnetic particle dispersed solution together form 100 wt %).

Other aspects and preferred embodiments of the invention are discussed infra.

BRIEF DESCRIPTION OF THE DRAWINGS

The above and other features of the present invention will now be described in detail with reference to a certain exemplary embodiment thereof illustrated the accompanying drawings which are given hereinbelow by way of illustration only, and thus are not limitative of the present invention, and wherein.

Figure 1:
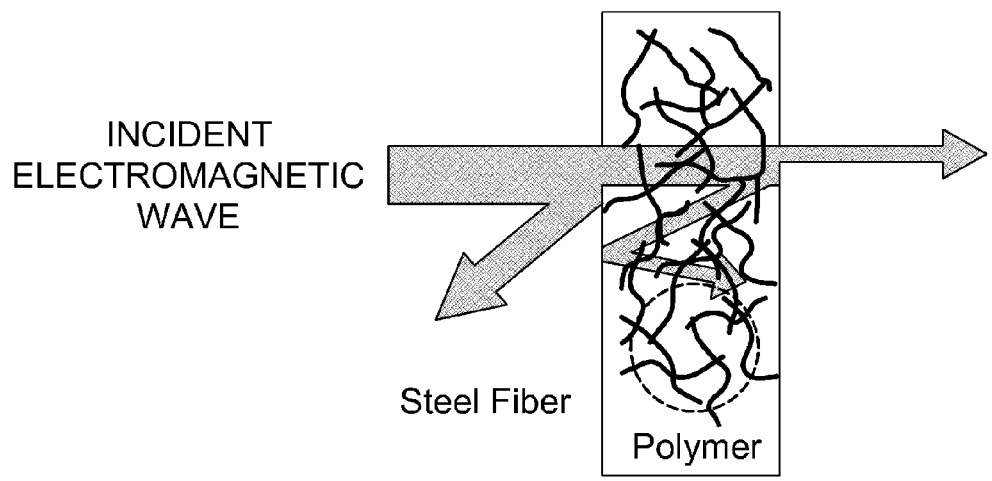
FIG. 1 schematically shows an electromagnetic shielding process of an electromagnetic shielding composite material.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, an exemplary embodiment of the present invention will be described in detail with reference to the accompanying drawings to allow those of ordinary skill in the art to easily carry out the present invention. While the invention will be described in conjunction with the exemplary embodiment, it will be understood that present description is not intended to limit the invention to the exemplary embodiment. On the contrary, the invention is intended to cover not only the exemplary embodiment, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Ranges provided herein are understood to be shorthand for all of the values within the range. For example, a range of 1 to 50 is understood to include any number, combination of numbers, or sub-range from the group consisting of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50, as well as all intervening decimal values between the aforementioned integers such as, for example, 1.1, 1.2, 1.3, 1.4, 1.5, 1.6, 1.7, 1.8, and 1.9. With respect to sub-ranges, "nested sub-ranges" that extend from either end point of the range are specifically contemplated. For example, a nested sub-range of an exemplary range of 1 to 50 may comprise 1 to 10, 1 to 20, 1 to 30, and 1 to 40 in one direction, or 50 to 40, 50 to 30, 50 to 20, and 50 to 10 in the other direction.

The present invention relates to a hybrid filler for an electromagnetic shielding composite material and a method of manufacturing the hybrid filler, by which an electromagnetic wave is shielded and absorbed, and heat generated by the absorption of the electromagnetic wave is effectively radiated. In particular, to provide effective electromagnetic shielding, various filler materials are mixed and an effective structure for heat radiation is made, so that shielding and absorbing capabilities for an incident electromagnetic wave are improved and, at the same time, heat generated by absorption is effectively removed.

Hereinafter, the present invention will be described in detail with reference to the accompanying drawings.

Figure 2:
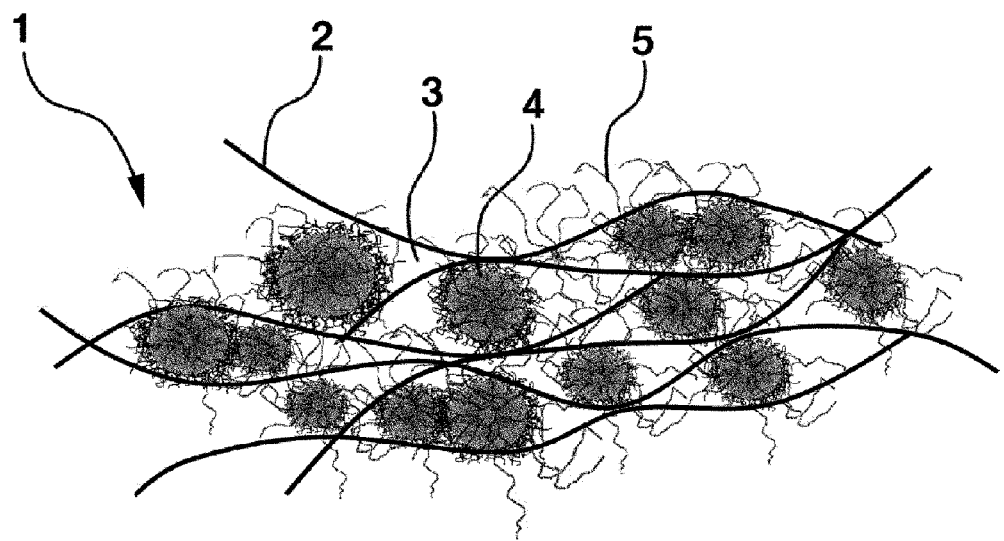
FIG. 2 schematically shows composition and structure of a hybrid filler for an electromagnetic shielding composite material according to an embodiment of the present invention.

As shown in FIG. 2, a hybrid filler 1 for a composite material according to the present invention includes expandable graphite (EG) 2, magnet particles (magnetic particles) 4, and carbon nanotubes (CNT) 5. The combination of these three filler materials in accordance with the present invention forms an effective structure for electromagnetic shielding and absorption and heat radiation.

The EGs can be selected from any known EGs, such as carbon-based sheet particles, and may be commercially available EGs which are thermally processed to form pores of generally several μm through several tens of μm in size therein according to their expansion rate.

More specifically, the EG 2 may have pores 3 (e.g., as shown in FIG. 2) of about 1-30 μm in size into which the magnetic particles 4 can be inserted. Further, the EG 2 in the hybrid filler 1 may have an overall size of several hundreds of μm.

The magnetic particles 4 preferably have a size of about 1-30 μm for insertion into the pores 3 of the EG 2. The magnetic particles 4 can be selected from various suitably sized magnetic particles, and preferably are selected from commercially available magnetic particles having an approximately spherical shape.

The magnetic particles 4 having the CNT 5 coated on the surfaces thereof can be formed in a variety of ways. For example, the CNT 5 may grow on the surfaces of the magnetic particles 4 through a chemical growth method using a catalyzer. The CNT 5 particles may also be coated on the surfaces of the magnetic particles 4 through a physical growth method, such as by using a CNT solution.

As the magnetic particles 4, iron (Fe), nickel (Ni), cobalt (Co), permalloy, sendust, ferrite powder, etc., which have superior permeability, may be used alone or in combination.

Herein, iron (Fe) generally has the highest permeability, and is preferably used as a main material of the magnetic particles (either used alone or in combination with other types of magnetic particle). As referred to herein, use of Fe (or any other magnetic particle material) as a "main" material generally means that it is used in a greater amount than any other material used in the magnetic particles, preferably wherein such use is at least 50 wt % based on total weight of the magnetic particles).

Through CNT growth (e.g., chemical growth method) using a catalyzer, through particle coating using a CNT solution, or through any other suitable coating method, magnetic particles 4 coated with the CNT 5 on the surfaces thereof (which will hereinafter be referred to as 'CNT-coated magnetic particles') are made. These CNT-coated magnetic particles are then inserted into the pores 3 of the EG 2, thus manufacturing the hybrid filler 1.

According to a preferred embodiment, the CNT-coated magnetic particles are inserted into the pores 3 of the EG 2 by a solution method. In particular, a solution containing the CNT-coated magnetic particles dispersed therein and the thermally-processed EG 2 are mixed, so that the solution containing the CNT-coated magnetic particles dispersed therein permeates into the pores 3 of the EG 2. In particular, the solution containing the CNT-coated magnetic particles dispersed therein permeates into the pores of the EG 2 due to a capillary phenomenon of the pores 3 of the EG 2. After the solution permeates the pores 3 of the EG 2, solvent is evaporated from the solution by subsequent thermal processing, thus manufacturing the hybrid filler 1 of 'CNT-Magnetic Particle-EG'.

An electromagnetic shielding composite material (see 6 of FIG. 3) manufactured using the hybrid filler 1 prepared as described above has improved EMI S.E., particularly through the multi-reflection effect of the CNT 5 in the hybrid filler 1.

When conductive materials are densely connected, an electromagnetic wave having various wavelength forms cannot pass through the conductive materials. On the other hand, in the case of a conductive network having large intervals between materials, some portion of an electromagnetic wave having a short wavelength is able to pass without being filtered.

Therefore, the hybrid filler 1 of the present invention, in which the EG 2 is surrounded by the CNT (CNT coated on the surfaces of the magnetic particles) 5, provides favorable interfacial contact between filers (EG 2, CNT 5, magnetic particles 4), and further has high shielding efficiency by the inclusion of the CNT 5.

The hybrid filler 1 of the present invention further generates heat due to absorption of an electromagnetic wave by the magnetic particles 4 upon incidence of electromagnetic waves. Further heat is generated by being transformed through electromagnetic absorption by the EG 2, which is a macro filler, and the CNT 5, which is a micro filer (see FIG. 3). The generated heat is radiated by a heat conduction phenomenon that occurs due to the EG 2 (heat conductivity (K): 200-500 W/mK) which has a superior heat transmission feature.

In other words, the heat transformed and radiated by the electromagnetic wave absorbed into the magnetic particles 4 is delivered directly to a graphite plate in contact with the periphery, that is, the EG 2. The EG 2 globally forms a heat transmission network in the composite material, effectively radiating heat, thus preventing reduction in the EMI S.E. by the heat accumulated in the composite material.

In terms of the efficiency of heat transmission, the electromagnetic shielding composite material, which includes the hybrid filler 1 of the present invention, improves heat transmission efficiency by forming a heat transmission path that includes the EG 2, and further reduces an interfacial resistance of heat transmission by the CNT 5 (which, as shown in the figures, is preferably formed in a microfibril form between macro fillers (EG)).

Figure 3:
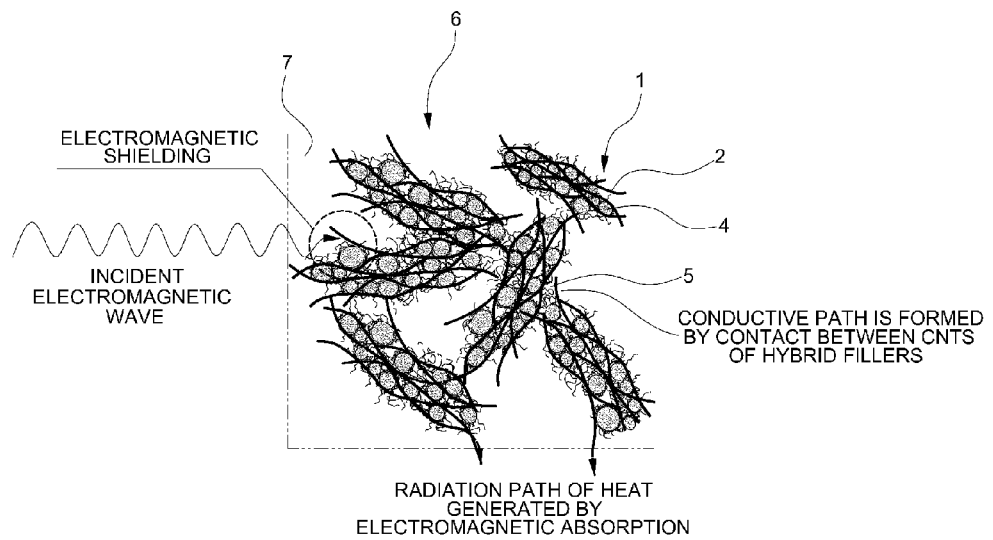
FIG. 3 schematically shows an electromagnetic shielding and heat radiating process of an electromagnetic shielding composite material manufactured using a hybrid filler according to an embodiment of the present invention.

Referring to FIG. 3, in the case of an electromagnetic shielding composite material 6 containing the hybrid fillers 1 of the present invention, heat generated by absorption of an electromagnetic wave is radiated to outside the composite material along a heat radiation path ("heat transmission path") formed by the EG 2. Further, a conductive path is formed by contact between the CNTs 5 of the hybrid fillers 1. Thus, the electric conduction effect and the heat transmission interfacial resistance reduction effect are both obtained.

As shown in FIG. 3, the electromagnetic shielding composite material 6 manufactured using the hybrid fillers 1 of the present invention includes a high polymer matrix 7 and the hybrid fillers 1 dispersed, preferably uniformly dispersed, in the matrix 7. The matrix 7 is not particularly limited, and can be selected from any conventional matrix materials.

According to an exemplary embodiment, the composite material 6 may be manufactured by mixing about 50-60 wt % of the high polymer matrix 7 and about 40-50 wt % of the hybrid fillers 1.

The composite material 6 manufactured in this way has a conductive path formed by contact between the CNTs 5 of the hybrid fillers.

As such, when the electromagnetic shielding composite material is manufactured using the hybrid filler according to the present invention, the EMI S.E. is improved by the macro carbon-based filler (EG) composed of conductive nano materials and the micro carbon-based filler (CNT), and the electromagnetic absorbing capability is improved by the magnetic particles, so that inter-path interference of an internal circuit board by the reflected electromagnetic waves and interference with peripheral electronic devices do not occur, and a source for the occurrence is shielded or absorbed.

Moreover, when the electromagnetic shielding composite material is manufactured using the hybrid filler according to the present invention, heat generated by electromagnetic absorption is effectively radiated through a heat transmission path formed by the EG, thus preventing degradation in the EMI S.E. due to the heat energy.

Hereinafter, a process of manufacturing a hybrid filler according to an exemplary embodiment of the present invention will be described in more detail.

Among the filler materials of the hybrid filler, the CNT is given a functional group through $H_2O_2$ processing to improve adhesiveness to the Fe particle (magnetic particle) surface. First, 0.5-1 wt % of the CNT is mixed with a $H_2O_2$ solution (the total of the CNT and the $H_2O_2$ solution is 100 wt %), and then the mixture is refluxed at 50-70° C. for 20-30 hours, after which the refluxed mixture is uniformly dispersed by a sonication process.

Next, the CNT remaining after evaporation of a solvent of the CNT-dispersed $H_2O_2$ solution is filtered by distilled water and cleaned, and then dried at 45-55° C. for 3-5 hours, so that a modified CNT giving a functional group to the CNT is manufactured.

Thereafter, a solution containing 0.5-2 wt % of the modified CNT and 1-3 wt % of a dispersant (e.g., sodium dodecyl sulfate (SDS)) is made by using 1,2-dichlorobenzene as a solvent, and is processed by ultrasonication processing for 30-60 minutes, so that a dispersion solution is manufactured.

0.5-2 wt % of Fe particles are dipped into the dispersion solution, and are dried at 50-70° C., so that CNT-coated magnetic particles are manufactured.

As the CNT-coated magnetic particles are inserted into the pores of the EG in the final hybrid filler, the CNT surrounds the EG in a microfibril form in such a way that the CNT covers the EG to some extent, in which according to a desired "covering degree", a content ratio between the CNT and the Fe particles can be adjusted. In particular, the "covering degree" refers to the amount to which the CNT covers the EG, wherein the CNT can partially cover the EG to any extent up to completely covering the EG.

When the content of the CNT is relatively high, the entire area (or most) of the EG may be covered with the CNT; when the content of the CNT is relatively low, the surface density of the CNT surrounding the EG is low.

According to various embodiments, commercially available EG (C-therm of Timcal or EG of Asbury) can be used, and is thermally processed in a furnace at 800° C. for 60-100 seconds, thus manufacturing an EG having pores of about 1-30 μm.

The thermal processing temperature and time are conditions that can be varied so as to provide a desired pore formation. If the thermal processing temperature and time are outside of optimized ranges, an expansion rate will be excessively high or low, resulting in a failure in pore formation.

By dispersing about 0.5-3 wt % of the manufactured CNT-coated magnetic particles in deionized water (the total of the CNT-coated magnetic particles and the deionized water is 100 wt %), a magnetic particle dispersed solution is made. Thereafter, about 0.5-1 wt % of graphite particles (EG)(based on weight of the magnetic particle dispersed solution) which have passed through the expansion process (thermal processing) are dipped into (or otherwise put into contact with) the magnetic particle dispersed solution.

In particular, the magnetic particle dispersed solution is formed by mixing 97-99.5 wt % of the deionized water with 0.5-3 wt % of the CNT-coated magnetic particles. Thereafter, 99-99.5 wt % of the magnetic particle dispersed solution is mixed with 0.5-1 wt % of the EG.

Then, the magnetic particle dispersed solution permeates into the pores of the EG due to the capillary phenomenon. After permeation by the magnetic particle dispersed solution, drying is performed at 50-100° C. for 24 hours to evaporate a solvent of the solution, thereby manufacturing the hybrid filler composed of CNT-Fe-EG.

Herein, the content ratio between the EG and the magnetic particles can be adjusted according to the desired form of the final hybrid filler. When the content of the magnetic particles is relatively high, the density of the hybrid filler is high and the density of the CNT surrounding the EG is also high. On the other hand, when the content of the magnetic particles is relatively low, a low-density hybrid filler is obtained and the density of the CNT surrounding the EG is also low.

40-50 wt % of the hybrid filler thus manufactured is then mixed with 50-60 wt % of a high polymer matrix, and the mixture may be used to manufacture the electromagnetic shielding composite material through general extrusion and injection processes.

The high polymer matrix resin used to form the electromagnetic shielding composite material is not particularly limited, and can include commercially available high polymer matrix resins including general thermoplastic resins, such as polyethylene, polypropylene, polystyrene, polyalkylene terephthalate, polyamide resin, polyacetal resin, polycarbonate, polysulfone, and polyimide.

The thermoplastic resin used as the high polymer matrix resin is preferably a semi-crystalline resin. This resin occupies a crystalline region of the high polymer matrix in crystallization to push the hybrid filler outside the resin, thus forming a conductive path well when compared to an amorphous resin.

To illustrate the present invention, 40 weight % of the hybrid filler manufactured by the foregoing method was mixed with 60 wt % of polyamide resin uniformly at a melting temperature of 260° C. at 100 rpm by using a Haake extruder, and then was manufactured as a standard test piece (test piece according to an embodiment of the present invention) of 100 mm×100 mm×3 mm through injection.

A test piece according to a comparative example was manufactured using the same method as used for the test piece according, but in place of the hybrid filler, 40 wt % of the CNT and Fe particles (the total content of the CNT and the Fe particles was 40 wt %) was used to manufacture a composite material test piece.

Figure 4:
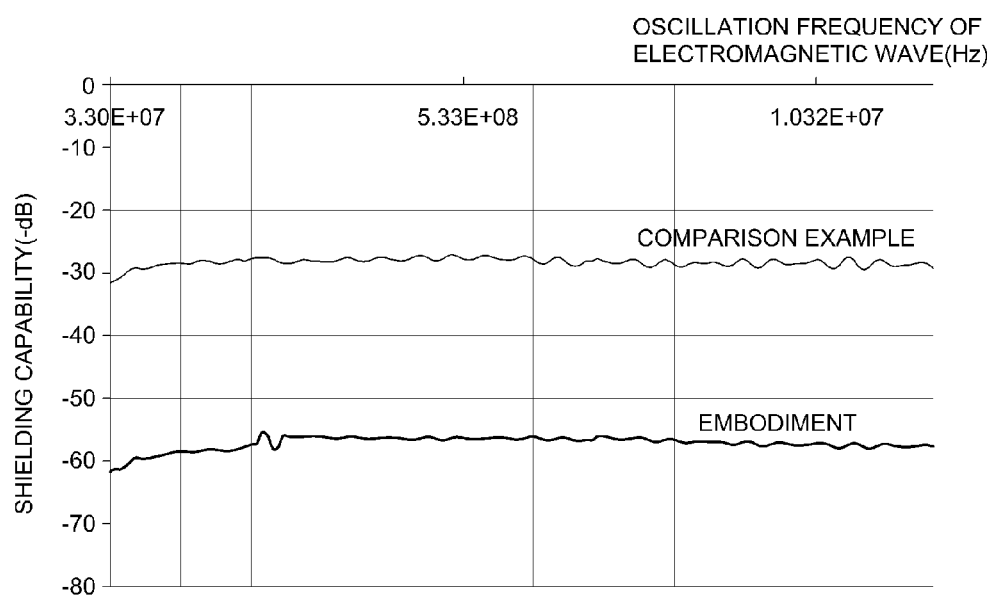
FIG. 4 shows shielding capability measurement results of an embodiment and a comparative example for illustrating effects of a hybrid filler according to the present invention.

FIG. 4 shows shielding capability measurement results for the test piece according to the comparative example and the test piece according to the embodiment of the present invention.

As shown in FIG. 4, it can be seen that the test piece according to the present invention, which contains hybrid particles, demonstrates superior shielding capability over the test piece of the comparative example.

As a result of measuring heat conductivity of a composite material manufactured in each of the comparative example and the embodiment of the present invention, the test piece of the comparative example shows a low heat conductivity of 0.83 W/mk in the thicknesswise direction thereof, while the test piece according to the present invention, which used the hybrid filler, shows a superior heat conductivity of 4.15 W/mk.

As is apparent from the foregoing description, the electromagnetic shielding composite material manufactured using the hybrid filler according to the present invention improves shielding and absorbing capabilities with respect to an incident electromagnetic wave, and effectively radiates heat generated due to electromagnetic absorption through a heat transmission path formed by the EG, thereby preventing degradation in the EMI S.E. due to heat energy.

Moreover, the composite material has improved electromagnetic absorbing capabilities due to the use of magnetic particles, so that inter-path interference of an internal circuit board by the reflected electromagnetic wave and interference with peripheral electronic devices do not occur and a source for the occurrence can be shielded or absorbed.

While an exemplary embodiment of the present invention has been described in detail, the protection scope of the present invention is not limited to the foregoing embodiment and it will be appreciated by those skilled in the art that various modifications and improvements using the basic concept of the present invention defined in the appended claims are also included in the protection scope of the present invention.

What is claimed is:

1. A hybrid filler for an electromagnetic shielding composite material, the hybrid filler comprising:
    an expandable graphite (EG) having a plurality of pores; and
    magnetic particles integrated with carbon nanotubes (CNT) on outer surfaces of the magnetic particles, wherein the magnetic particles are inserted within the pores of the EG.

2. The hybrid filler of claim 1, wherein the pores are about 1-30 μm in size.

3. The hybrid filler of claim 1, wherein the magnetic particles are about 1-30 μm in size.

4. The hybrid filler of claim 1, wherein the magnetic particles are selected from a group consisting of iron (Fe), nickel (Ni), cobalt (Co), permalloy, sendust, ferrite powder, and combinations thereof.

5. A method of manufacturing a hybrid filler for an electromagnetic shielding composite material, the method comprising:
    preparing an expandable graphite (EG) having a plurality of pores;
    manufacturing carbon nanotube (CNT)-coated magnetic particles by adhering CNTs on outer surfaces of the magnetic particles;
    dispersing the carbon nanotube (CNT)-coated magnetic particles in a solvent to form a magnetic particle dispersed solution;
    dipping the EG into the magnetic particle dispersed solution so that the magnetic particle dispersed solution permeates into the pores of the EG; and
    evaporating the solvent by drying the magnetic particle dispersed solution into which the EG is dipped.

6. The method of claim 5, wherein the step of preparing the EG having a plurality of pores comprises heat-processing the EG at about 800° C. for about 60-100 seconds.

7. The method of claim 5, wherein the step of preparing the expandable graphite (EG) having a plurality of pores is carried out to provide pores about 1-30 μm in size.

8. The method of claim 5, wherein the step of manufacturing of the CNT coated magnetic particles comprises growing the CNT on the outer surfaces of the magnetic particles through chemical growth using a catalyzer, or coating the CNT on the outer surfaces of the magnetic particles through particle coating.

9. The method of claim 5, wherein the magnetic particle dispersed solution comprises about 97-99.5 wt % of deionized water and about 0.5-3 wt % of the CNT coated magnetic particles based on total weight of the magnetic particle dispersed solution.

10. The method of claim 5, wherein the step of contacting the EG with the magnetic particle dispersed solution so that the magnetic particle dispersed solution permeate into the pores of the EG comprises combining about 0.5-1 wt % of the EG and about 99-99.5 wt % magnetic particle dispersed solution.

11. The method of claim 5, wherein the CNTs comprise CNTs given a functional group through $H_2O_2$ processing CNT.

12. An electromagnetic shielding composite material comprising a high polymer matrix containing the hybrid filler of claim 1 dispersed therein.

13. The electromagnetic shielding composite material of claim 12, comprising about 50-60 wt % of the high polymer matrix and about 40-50 wt % of the hybrid filler.

14. The electromagnetic shielding composite material of claim 12, comprising a conductive path formed by contact between CNTs of hybrid filler particles dispersed in the high polymer matrix.

15. The electromagnetic shielding composite material of claim 12, wherein the high polymer matrix is selected from the group consisting of polyethylene, polypropylene, polystyrene, polyalkylene terephthalate, polyamide resin, polyacetal resin, polycarbonate, polysulfone, polyimide, and combinations thereof.

* * * * *